(12) United States Patent
Yogo et al.

(10) Patent No.: US 9,169,940 B2
(45) Date of Patent: Oct. 27, 2015

(54) PURGE LINE CHANGING BLOCK JOINT AND FLUID CONTROL APPARATUS

(71) Applicant: FUJIKIN INCORPORATED, Osaka-shi (JP)

(72) Inventors: Ryuji Yogo, Osaka (JP); Izuru Shikata, Osaka (JP); Mutsunori Koyomogi, Osaka (JP); Megumu Makino, Osaka (JP); Takahiro Matsuda, Osaka (JP)

(73) Assignee: FUJIKIN INCORPORATED, Osaka-shi (JP)

( * ) Notice: Subject to any disclaimer, the term of this patent is extended or adjusted under 35 U.S.C. 154(b) by 0 days.

(21) Appl. No.: 14/130,077

(22) PCT Filed: Feb. 20, 2013

(86) PCT No.: PCT/JP2013/054170
§ 371 (c)(1),
(2) Date: Dec. 30, 2013

(87) PCT Pub. No.: WO2013/129205
PCT Pub. Date: Sep. 6, 2013

(65) Prior Publication Data
US 2015/0152969 A1    Jun. 4, 2015

(30) Foreign Application Priority Data

Feb. 29, 2012 (JP) ................................. 2012-043124

(51) Int. Cl.
*F16K 27/00* (2006.01)
*C23C 16/455* (2006.01)

(52) U.S. Cl.
CPC ......... *F16K 27/003* (2013.01); *C23C 16/45561* (2013.01); *Y10T 137/4259* (2015.04); *Y10T 137/87885* (2015.04)

(58) Field of Classification Search
CPC ................. Y10T 137/4259; Y10T 137/87885; F16K 27/03; C23C 16/45561
See application file for complete search history.

(56) References Cited

U.S. PATENT DOCUMENTS 6,152,175 A    11/2000    Itoh et al.
6,435,215 B1 *    8/2002    Redemann et al. ........... 137/884
(Continued)

FOREIGN PATENT DOCUMENTS

JP    11-51226 A    2/1999
JP    2000-320697 A    11/2000
(Continued)

OTHER PUBLICATIONS

International Search Report mailed Apr. 2, 2013, issued for PCT/JP2013/054170.

*Primary Examiner* — John Fox
(74) *Attorney, Agent, or Firm* — Locke Lord LLP; James E. Armstrong, IV (57) ABSTRACT

A purge line changing block joint for enabling supply of different types of purge gas between lines without a significant remodeling of a fluid control apparatus and the fluid control apparatus is provided. A purge line changing block joint is connected to an upper side of a three-way valve channel portion in at least one line of the plurality of lines. The purge line changing block joint includes a process gas inlet channel communicating with a process gas inlet channel of the three-way valve channel portion, an outlet channel communicating the process gas inlet channel and an outlet channel of the three-way valve channel portion, a channel terminal not in communication with a purge gas inlet channel of the three-way valve channel portion but terminating the same, and a new purge gas inlet channel communicating with the outlet channel and opening on the top surface.

2 Claims, 6 Drawing Sheets

(56) References Cited

U.S. PATENT DOCUMENTS

| | | | |
|---|---|---|---|
| 7,562,677 B2 * | 7/2009 | Perusek et al. | 137/884 |
| 7,806,143 B2 * | 10/2010 | Taskar | 137/884 |
| 7,918,938 B2 * | 4/2011 | Provencher et al. | 118/715 |
| 8,307,854 B1 * | 11/2012 | Vu | 137/884 |
| 8,434,522 B2 * | 5/2013 | Okase et al. | 137/884 |
| 2001/0020488 A1 | 9/2001 | Ishii et al. | |
| 2009/0183792 A1 | 7/2009 | Tokuda et al. | |

FOREIGN PATENT DOCUMENTS

| | | |
|---|---|---|
| JP | 2001-254900 A | 9/2001 |
| WO | WO-2007/032147 A1 | 3/2007 |

\* cited by examiner

PURGE LINE CHANGING BLOCK JOINT AND FLUID CONTROL APPARATUS

TECHNICAL FIELD

The present invention relates to a purge line changing block joint used in a fluid control apparatus formed by integrating a plurality of fluid control instruments and a fluid control apparatus provided with such a purge line changing block joint.

BACKGROUND ART

In the fluid control apparatus used in a semiconductor manufacturing apparatus, integration which configures the fluid control apparatus without intermediary of a pipe or a joint by installing a line on which a plurality of fluid control instruments are arranged side by side and mounted on corresponding supporting members on a base member in a parallel pattern is now in development. In Patent Literature 1, utilization of a manifold block joint in such a fluid control apparatus is disclosed.

Figure 4:
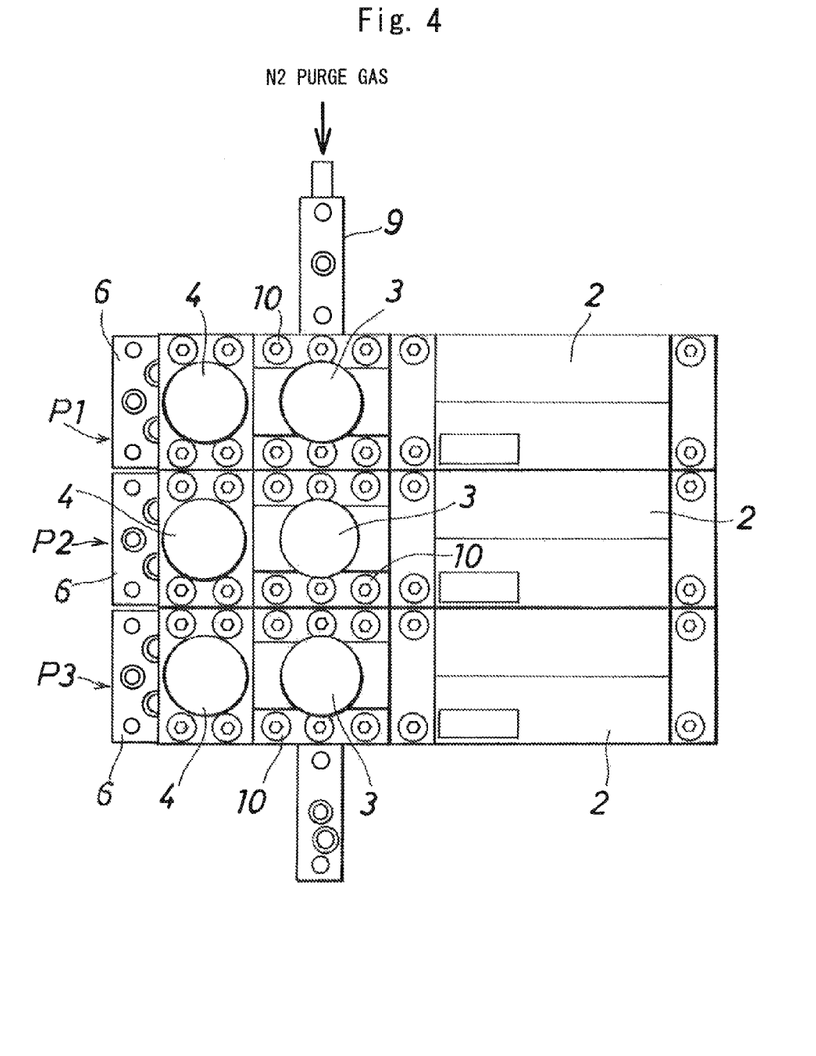
FIG. 4 is a plan view illustrating a fluid control apparatus of the related art.
Figure 5:
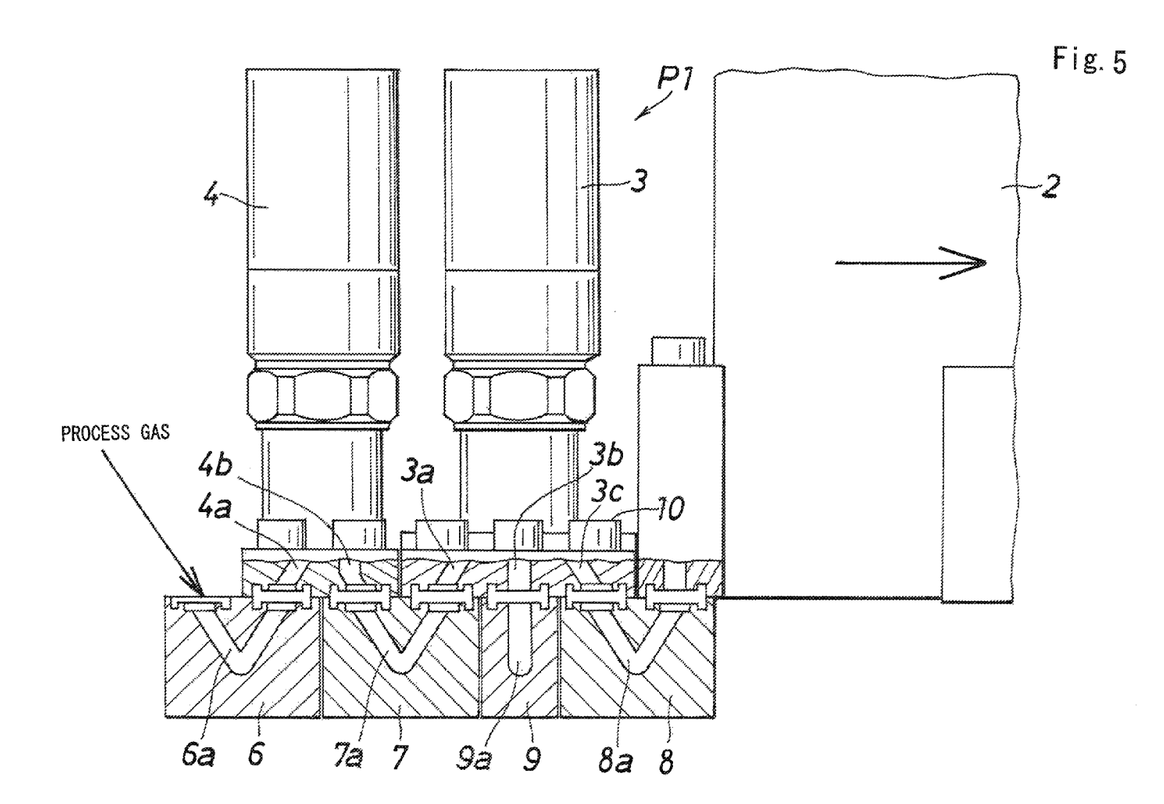
FIG. 5 is a side view illustrating one of lines of the fluid control apparatus of the related art taken along a channel portion.
Figure 6:
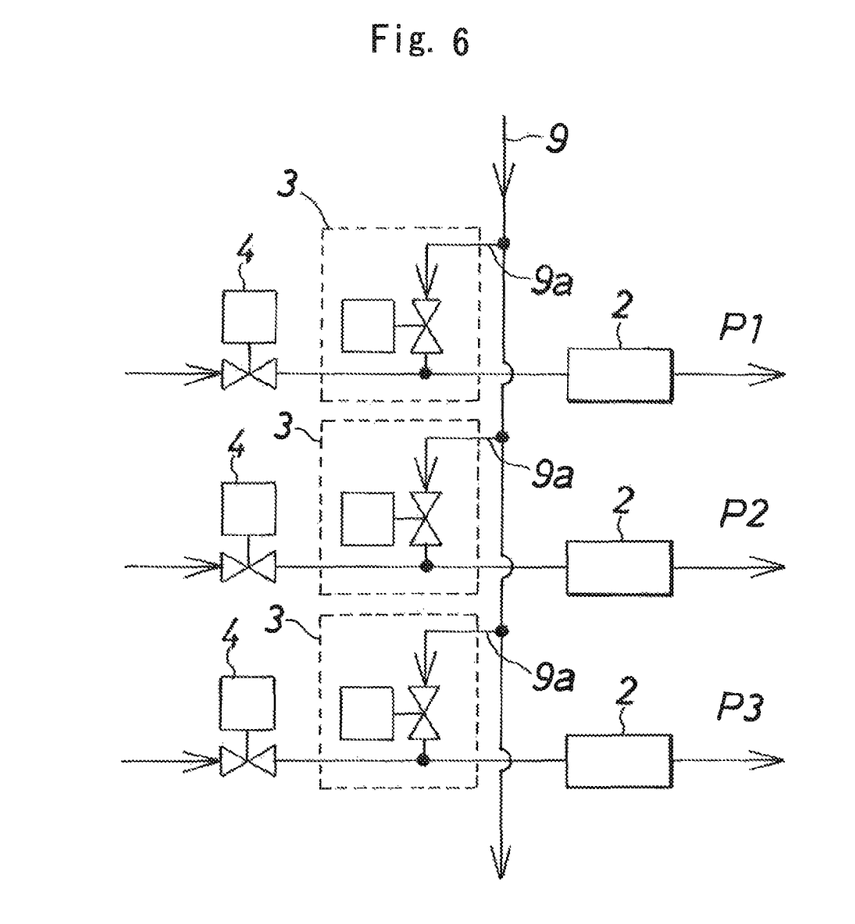
FIG. 6 is a flow chart illustrating gas flows in the fluid control apparatus of the related art.

FIG. 4 to FIG. 6 illustrate a fluid control apparatus of the related art which is an intended apparatus of the fluid control apparatus of the present invention.

The fluid control apparatus of the related art includes a plurality of (only three of those are illustrated) lines (P1), (P2), (P3) as illustrated in FIG. 4.

Each of the lines (P1), (P2), (P3) includes a plurality of fluid control instruments (2), (3), (4) arranged on an upper stage and a plurality of joint members (6), (7), (8), (9) arranged on a lower stage to support each of the plurality of the fluid control instruments (2), (3), (4) as illustrated in FIG. 5. Each of the lines (P1), (P2), (P3) includes the three block joints (6), (7), (8) having V-shaped channels (6*a*), (7*a*), (8*a*) opening on the top surface respectively, and a manifold block joint (9) having a plurality of line-to-line connecting bifurcated channels (9*a*) opening on the top surface as the plurality of joint members (6), (7), (8), (9).

The fluid control instruments (2), (3), (4) are fixed to the corresponding joint members (6), (7), (8), (9) via bolts (10) respectively.

Each of the lines (P1), (P2), (P3) includes a mass flow controller (2), a three-way valve (3) arranged immediately upstream side of the mass flow controller (2), and a two-way valve (4) arranged immediately upstream side of the three-way valve (3) as the plurality of fluid control instruments (2), (3), (4), respectively.

The two-way valve (4) is provided with a gas inlet channel for process gas (4*a*) and a gas outlet channel for process gas (4*b*) opening respectively on a lower surface thereof, and the three-way valve (3) is provided with a gas inlet channel for process gas (3*a*), a purge gas inlet channel (3*b*), and an outlet channel (3*c*) common to both gases opening respectively on a lower surface thereof.

The three-way valves (3) are supported by the two block joints (7), (8) and part of the single manifold block joint (9) common to the three lines (P1), (P2), (P3). In this manner, the three-way valves (3) are supported by the three block joints (7), (8), (9) in total, and a channel portion for a three-way valve including a process gas inlet channel (7*a*), a purge gas inlet channel (9*a*), and an outlet channel (8*a*) common to both gases opening respectively on the top surface is formed by these block joints (7), (8), (9).

In the respective lines (P1), (P2), (P3) of the fluid control apparatus, as illustrated in FIG. 6, process gas channels each extending from the two-way valve (4) to the mass flow controller (2) via the three-way valve (3) and purge gas (for example, N2 gas) channels each extending from the inlet channel for purge gas (9*a*) of the manifold block joint (9) to the mass flow controller (2) via the three-way valve (3) are formed.

CITATION LIST

Patent Literature

PTL 1: JP-A-2001-254900

SUMMARY OF INVENTION

Technical Problem

The fluid control apparatus of the related art described above has an advantage that piping is simplified by using the manifold block joint, and hence the maintenance is facilitated. In this case, however, using the same type of gas for the respective lines as purge gas is required and, for example, it is not possible to supply nitrogen gas to a certain line as the purge gas and supply another type of gas (for example, argon gas) to a different line as purge gas. There is a problem that significant remodeling of the fluid control apparatus is necessary in order to use different types of purge gas between the lines.

It is an object of the present invention to provide a purge line changing block joint for enabling supply of different types of purge gas between lines without a significant remodeling of a fluid control apparatus and the fluid control apparatus provided with such purge line changing block joint.

Solution to Problem

A purge line changing block joint according to the present invention is a purge line changing block joint configured to be connected to an upper side of a lower stage joint member which forms a process gas inlet channel, a purge gas inlet channel, and an outlet channel common to both gases opening respectively on the top surface, including: a process gas inlet channel in communication with a process gas inlet channel of the lower stage joint member, an outlet channel communicating the process gas inlet channel and the outlet channel of the lower stage joint member, a channel terminal not in communication with the purge gas inlet channel of the lower stage joint member but terminating the same, and a new purge gas inlet channel in communication with the outlet channel.

Although the lower stage joint member is not specifically limited, but normally includes a plurality of block joints, for example, a block joint having a process gas inlet channel, a block joint having a purge gas inlet channel, and a block joint having an outlet channel common to both gases.

A fluid control apparatus according to the present invention is a fluid control apparatus including: a plurality of lines arranged in parallel, each of the lines including a flow rate controller, a two-way valve, and a three-way valve arranged on an upper stage and a plurality of joint members arranged on a lower stage, a manifold block joint as a joint member arranged on the lower stage and configured to connect at least two of the plurality of lines, the plurality of joint members arranged on a lower side of the three-way valve forming a three-way valve channel portion including a process gas inlet channel, a purge gas inlet channel, and an outlet channel common to both gases opening respectively on the top surface by the block joint or part of the manifold block joint provided for each of the lines, the three-way valve including a gas inlet channel for process gas, a purge gas inlet channel, and an outlet channel common to both gases opening respectively on the bottom surface thereof so that purge gas is fed to the flow rate controller by the three-way valve, wherein the three-way valve is connected to an upper side of the three-way valve channel portion in at least one of the plurality of lines, a purge line changing block joint is connected to the upper side of the three-way valve channel portion in at least one of the plurality of lines, the purge line changing block joint includes a process gas inlet channel in communication with the process gas inlet channel of the three-way valve channel portion, an outlet channel communicating the process gas inlet channel and the outlet channel of the three-way valve channel portion, a channel terminal not in communication with the purge gas inlet channel of the three-way valve channel portion but terminating the same, and a new purge gas inlet channel in communication with the outlet channel.

According to the purge line changing block joint and the fluid control apparatus of the present invention, since the purge line changing block joint includes the process gas inlet channel in communication with the process gas inlet channel of the lower stage joint member (three-way channel portion), the outlet channel communicating the process gas inlet channel and the outlet channel of the lower stage joint member (three-way valve channel portion), the channel terminal not in communication with the purge gas inlet channel of the lower stage joint member (three-way valve channel portion) but terminating the same, and the new purge gas inlet channel in communication with the outlet channel and opening on the top surface, the purge line changing block joint may be connected to the upper side of the lower stage joint member which forms the three-way channel portion including the process gas inlet channel, the purge gas inlet channel, and the outlet channel common to both gases opening respectively on the top surface. Therefore, the purge gas channel of the related art is blocked by the channel termination of the purge line changing block joint by replacing the three-way valve connected to the upper side of the lower stage joint member which forms the three-way valve channel portion with the purge line changing block joint, so that a different type of purge gas can be introduced from the new purge gas inlet channel of the purge line changing block joint. The operation for adding the different type of purge gas is achieved only by demounting the three-way valve by removing the bolts and mounting the purge line changing block joint to a position where the three-way valve is removed from with the bolts, so that significant remodeling of the fluid control apparatus is not necessary.

The flow rate controller, the two-way valve, and the three-way valve are part of the fluid control instrument which constitutes the line, and a pressure reducing valve, an instrument for measuring and displaying pressure and flow rate, and a filter are arranged adequately as needed in addition to the flow rate controller, the two-way valve, and the three-way valve in each of the lines. As the flow rate controller, a thermal type mass flow rate control apparatus or a pressure-type flow rate control apparatus such as a mass flow controller is used.

Figure 2:
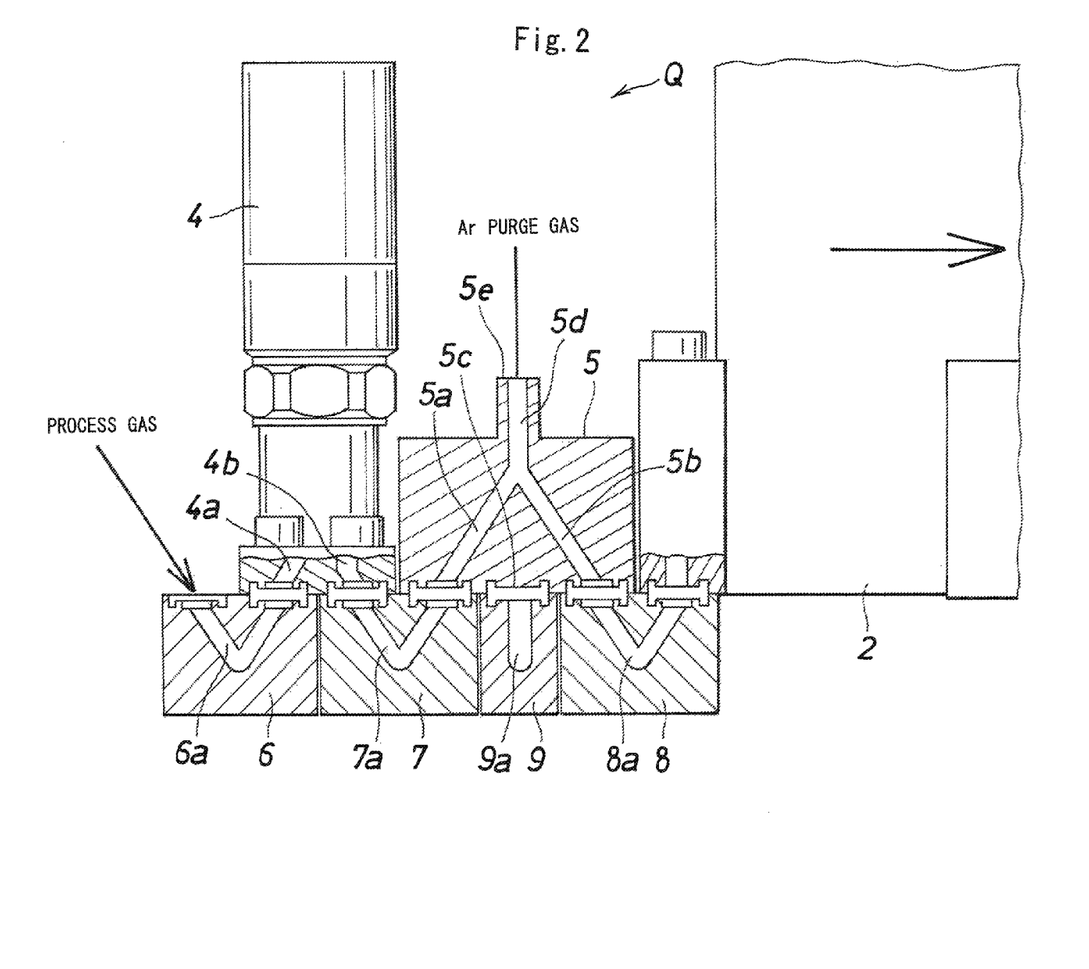
FIG. 2 is a side view illustrating one of lines of the fluid control apparatus of the present invention taken along a channel portion.

In this specification, the term up and down corresponds to up and down of FIG. 2. However, the term up and down is only for convenience, and the fluid control apparatus of the present invention may be used either horizontally or vertically.

Advantageous Effect of the Invention

According to the purge line changing block joint and the fluid control apparatus of the present invention, a different type of purge gas can be introduced from a new purge gas inlet channel of the purge line changing block joint without performing a significant remodeling of the fluid control apparatus by replacing the three-way valve connected to the upper side of the lower stage joint member which forms the three-way valve channel portion with the purge line changing block joint.

REFERENCE SIGNS LIST (1) fluid control apparatus, (2): mass flow controller (flow rate controller), (3): three-way valve, (3a): gas inlet channel for process gas, (3b): purge gas inlet channel, (3c): outlet channel, (4) two-way valve, (5): purge line changing block joint, (5a): process gas inlet channel, (5b): outlet channel, (5c): channel terminal, (5d): new purge gas inlet channel, (7) (8): block joints (joint members), (9): manifold block joint (joint member), (7a): process gas inlet channel, (8a): outlet channel, (9a): purge gas inlet channel

DESCRIPTION OF EMBODIMENTS

Embodiments of the present invention will be described with reference to the drawings below.

Figure 1:
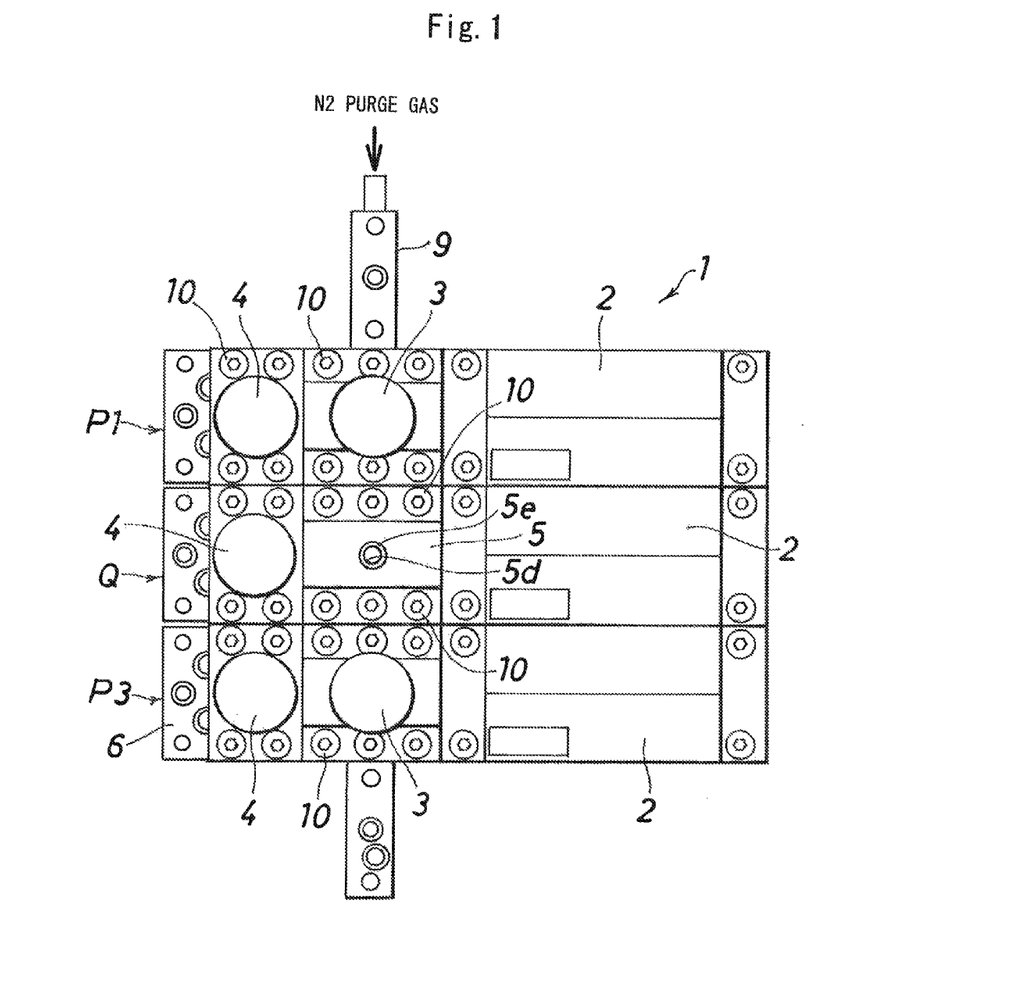
FIG. 1 is a plan view illustrating an embodiment purge line changing block joints and a fluid control apparatus according to the present invention.
Figure 3:
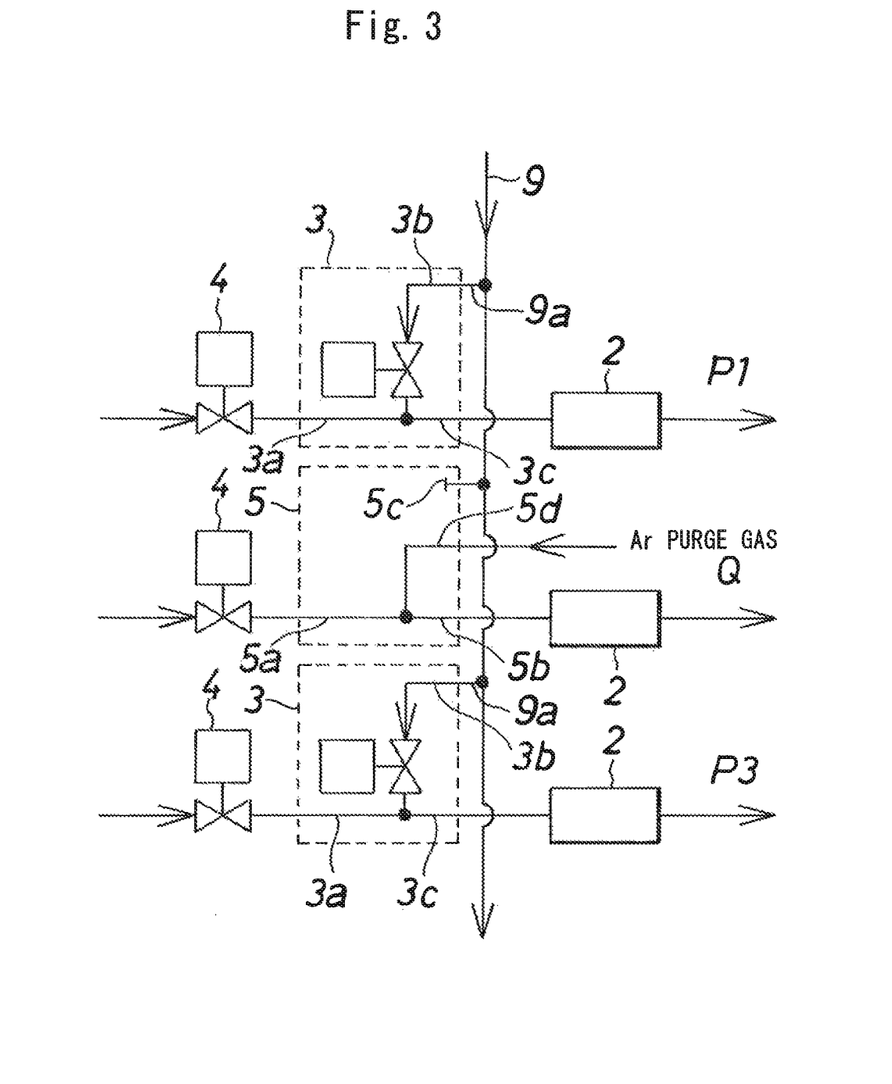
FIG. 3 is a flow chart illustrating gas flows in the fluid control apparatus of the present invention.

FIG. 1 to FIG. 3 illustrate principal portions of the fluid control apparatus of the present invention. A fluid control apparatus (1) is used in a semiconductor manufacturing apparatus or the like and, as illustrated in FIG. 1, includes a plurality of (only from the first to the third are illustrated) lines (P1), (Q), (P3).

The respective lines (P1), (Q), (P3) include a plurality of fluid control instruments (2), (3), (4), (5) arranged on an upper stage and a plurality of joint members (6), (7), (8), (9) arranged on a lower stage to support the plurality of the fluid control instruments (2), (3), (4), (5). The respective fluid control instruments (2), (3), (4) (5) are fixed to the corresponding joint members (6), (7), (8), (9) via bolts (10).

The respective lines (P1), (Q), (P3) include the three block joints (6), (7), (8) having V-shaped channels (6a), (7a), (8a) opening respectively on the top surface, and a manifold block joint (9) having a plurality of line-to-line connecting bifurcated channels (9a) opening on the top surface as the plurality of the joint members (6), (7), (8), (9).

The first and third lines (P1), (P3) have the same configuration as the line (P1) illustrated in FIG. 5, and include a mass flow controller (flow rate controller) (2), a three-way valve (3) arranged immediately upstream side of the mass flow controller (2), and a two-way valve (4) arranged immediately upstream side of the three-way valve (3) as the plurality of fluid control instruments (2), (3), (4) respectively.

The second line (Q) includes a mass flow controller (2), a purge line changing block joint (5) arranged immediately upstream side of the mass flow controller (2), and a two-way valve (4) arranged immediately upstream side of the purge line changing block joint (5) as the plurality of fluid control instruments (2), (4), (5) respectively, as illustrated in FIG. 2. In other words, in the second line (Q), the three-way valve (3) as that provided in the first and third lines (P1), (P3) is replaced by the purge line changing block joint (5) of the present invention.

The mass flow controller (2), the three-way valve (3), the two-way valve (4), and the block joint (6), (7), (8), (9) arranged on the lower stage are the same as those illustrated in FIG. 5. In other words, the two-way valve (4) is provided with a gas inlet channel for process gas (4a) and a gas outlet channel for process gas (4b) opening respectively on a lower surface thereof, and the three-way valve (3) (see FIG. 5) is provided with a process gas inlet channel (3a), a purge gas inlet channel (3b), and an outlet channel (3c) common to both gases opening on a lower surface thereof. In the three-way valve (3), the process gas inlet channel (3a) and the outlet channel (3c) are always in communication, and the purge gas inlet channel (3b) and the outlet channel (3c) are brought into communication or out communication by switching the position of the three-way valve (3).

The two-way valve (4) is supported by the two block joints (6), (7), and the three-way valve (3) is supported by the block joints (7), (8) and part of the single manifold block joint (9) common to the three lines (P1), (Q), (P3). In this manner, the three-way valve (3) is supported by the three block joints (7), (8), (9) in total, and a three-way valve channel portion including a process gas inlet channel (7a), a purge gas inlet channel (9a), and an outlet channel (8a) common to both gases opening respectively on the top surface is formed by these block joints (7), (8), (9).

The purge line changing block joint (5) has a square shape in plan view (FIG. 1) and a substantially square shape in side view (FIG. 2), is formed into a block shape projecting at a center portion in front view (not illustrated), and both end portions having a lower level are mounted on the corresponding block joints (7), (8), (9) with the bolts (10) as illustrated in FIG. 1.

The purge line changing block joint (5) includes a process gas inlet channel (5a) in communication with the process gas inlet channel (7a) of the three-way valve channel portion, an outlet channel (5b) common to both gases communicating the process gas inlet channel (5a) and the outlet channel (8a) of the three-way valve channel portion, a channel terminal (5c) not in communication with the purge gas inlet channel (9a) of the three-way valve channel portion but terminating the same, and a new purge gas inlet channel (5d) in communication with the outlet channel (5b) and opening on the top surface. The new purge gas inlet channel (5d) is provided with a cylindrical projecting portion (5e) so as to allow connection to external piping. The new purge gas inlet channel (5d) also in communication with the process gas inlet channel (5a), and the new purge gas inlet channel (5d), the process gas inlet channel (5a), and the outlet channel (5b) form an inverted Y-shape in side view.

As illustrated in FIG. 3, in the first and third lines (P1), (P3) in the fluid control apparatus (1), process gas channels each extending from the two-way valve (4) to the mass flow controller (2) via the three-way valve (3) and purge gas (for example, nitrogen N2 gas) channels each extending from the purge gas inlet channel (9a) of the manifold block joint (9) to the mass flow controller (2) via the three-way valve (3) are formed in the same manner as the related art.

By using the purge line changing block joint (5), a process gas channel extending from the two-way valve (4) to the mass flow controller (2) via the process gas inlet channel (5a) and the outlet channel (5b) of the purge line changing block joint (5) is formed in the second line (Q). As regards a channel extending from the purge gas inlet channel (9a) of the manifold block joint (9) to the mass flow controller (2) via the purge line changing block joint (5) (the purge gas channel similar to the first and third lines (P1), (P3)), the channel terminal (5c) is provided on the purge line changing block joint (5), and introduction of purge gas from the manifold block joint (9) is stopped by the channel terminal (5c) which closes the purge gas inlet channel (9a). Since the purge line changing block joint (5) is provided with the new purge gas inlet channel (5d) in communication with the outlet channel (5b) common to both gases and opening on the top surface, the purge gas (argon Ar gas in this case) can be introduced through a system different from the manifold block joint (9) by using the new purge gas inlet channel (5d), whereby an Ar purge gas channel extending to the mass flow controller (2) via the purge line changing block joint (5) is formed.

In this manner, in all the lines (P1), (Q), (P3), process gas and purge gas are introduced into the mass flow controller (2). As regards the purge gas, the same purge gas is supplied to the two lines (P1), (P3) via the manifold block joint (9), and a different type of purge gas can be supplied to the remaining line (Q). Therefore, according to the purge line changing block joint (5) of the present invention, by replacing any one of the three-way valves (3) (provided in the line (P2) in FIG. 4) of the fluid control apparatus of the related art with the purge line changing block joint (5), the process gas can be flowed as in the related art, and a different type of the purge gas (argon gas, for example) can be supplied from above the purge line changing block joint (5) while blocking a purge gas supply channel of the related art (for example, a nitrogen gas supply channel). Here, the operation to be performed for changing the type of the purge gas is achieved only by demounting the three-way valve (3) by removing the bolts (10) and mounting the purge line changing block joint (5) to a position where the three-way valve (3) is removed from with the bolts (10), so that the type of the purge gas can be changed extremely easily without the necessity of a significant remodeling of the fluid control apparatus (1).

Although only the three lines (P1), (Q), (P2) are illustrated in the description given above, a plurality of, four or more, lines are also applicable. In this case, the three-way valve is connected to an upper side of the three-way valve channel portion in at least one of the plurality of lines and the purge line changing block joint is connected to the upper side of the three-way vale channel portion in at least one of the plurality of lines. In a case where the process gas is introduced in a state in which the purge line changing block joint is mounted, the new purge gas inlet channel (9a) portion becomes a so-called dead space (gas trap), and hence a method of reducing the dead space, for example, by reducing the length of the flow channel, or employing a structure in which the process gas inlet channel (5a) and the outlet channel (5b) are constantly in communication by using a mechanism of the three-way valve may be employed.

INDUSTRIAL AVAILABILITY

According to the present invention, a different type of purge gas can be introduced from a new purge gas inlet channel of the purge line changing block joint without performing a significant remodeling of the fluid control apparatus by replacing the three-way valve connected to the upper side of the lower stage joint member which forms the three-way valve channel portion with the purge line changing block joint, so that the invention contributes to improvement of performance of the fluid control apparatus formed by integrating a plurality of fluid control instruments.

The invention claimed is:

1. A purge line changing block joint configured to be connected to an upper side of a lower stage joint member which forms a process gas inlet channel, a purge gas inlet channel, and an outlet channel common to both gases opening respectively on the top surface, comprising:
   a process gas inlet channel in communication with the process gas inlet channel of the lower stage joint member, an outlet channel communicating the process gas inlet channel and the outlet channel of the lower stage joint member, a channel terminal not in communication with the purge gas inlet channel of the lower stage joint member but terminating the same, and a new purge gas inlet channel in communication with the outlet channel.

2. A fluid control apparatus comprising: a plurality of lines arranged in parallel, each of the lines including a flow rate controller, a two-way valve, and a three-way valve arranged on an upper stage and a plurality of joint members arranged on a lower stage, a manifold block joint as a joint member arranged on the lower stage and configured to connect at least two of the plurality of lines, the plurality of joint members arranged on a lower side of the three-way valve forming a three-way valve channel portion including a process gas inlet channel, a purge gas inlet channel, and an outlet channel common to both gases opening respectively on the top surface by a block joint or part of the manifold block joint provided for each of the lines, the three-way valve including a gas inlet channel for process gas, purge gas inlet channel, and an outlet channel common to both gases opening in a lower surface thereof so that purge gas is fed to the flow rate controller by the three-way valve, wherein
   the three-way valve is connected to an upper side of the three-way valve channel portion in at least one of the plurality of lines, a purge line changing block joint is connected to the upper side of the three-way valve channel portion in at least one of the plurality of lines, the purge line changing block joint includes a process gas inlet channel in communication with the process gas inlet channel of the three-way valve channel portion,
   an outlet channel communicating the process gas inlet channel and the outlet channel of the three-way valve channel portion,
   a channel terminal not in communication with the purge gas inlet channel of the three-way valve channel portion but terminating the same, and
   a new purge gas inlet channel in communication with the outlet channel.

* * * * *